United States Patent
Graw (10) Patent No.: US 11,638,345 B2
(45) Date of Patent: Apr. 25, 2023

(54) FEED FORWARD COMPENSATION OF PARASITIC CAPACITANCE IN A DEVICE FRONTEND

(71) Applicant: Fluke Corporation, Everett, WA (US)

(72) Inventor: Jeffrey D. Graw, Woellersdorf (AT)

(73) Assignee: Fluke Corporation, Everett, WA (US)

( * ) Notice: Subject to any disclaimer, the term of this patent is extended or adjusted under 35 U.S.C. 154(b) by 131 days.

(21) Appl. No.: 17/222,391

(22) Filed: Apr. 5, 2021

(65) Prior Publication Data

US 2022/0322520 A1 Oct. 6, 2022

(51) Int. Cl.
*H05K 1/02* (2006.01)
*G01R 15/04* (2006.01)
*G01R 19/00* (2006.01)

(52) U.S. Cl.
CPC ........... *H05K 1/0216* (2013.01); *G01R 15/04* (2013.01); *G01R 19/0084* (2013.01)

(58) Field of Classification Search
CPC ........ G01R 15/00; G01R 15/04; G01R 19/00; G01R 19/0084; G01R 19/0092; H05K 1/00; H05K 1/02; H05K 1/0213; H05K 1/0216
See application file for complete search history.

(56) References Cited

U.S. PATENT DOCUMENTS

| | | |
|---|---|---|
| 5,408,236 A | 4/1995 | Freiheit-Jensen et al. |
| 6,100,750 A | 8/2000 | Van Der Zee |
| 7,000,478 B1 * | 2/2006 | Zwollo ................. G01L 19/148 73/708 |
| 7,986,501 B2 * | 7/2011 | Kamor ................... H01H 83/04 361/42 |
| 2005/0285660 A1 | 12/2005 | Bruin et al. |
| 2006/0109033 A1 | 5/2006 | Sundaram |
| 2009/0175419 A1 | 7/2009 | Jedlitschka |
| 2017/0367174 A1 | 12/2017 | Caiafa |

OTHER PUBLICATIONS

Extended European Search Report, dated Aug. 18, 2022, for European Application No. 22161600.6-1001, 7 pages.

* cited by examiner

*Primary Examiner* — Hoai-An D. Nguyen
(74) *Attorney, Agent, or Firm* — Seed IP Law Group LLP (57) ABSTRACT

Feed forward compensation of parasitic capacitance in a device frontend is provided. A feed forward element is positioned along at least a portion of a length of a first input resistance and a distance away from the first input resistance. In some implementations, the feed forward element has a width that is increasing along the at least a portion of the length of the first input resistance. The feed forward element is operative to introduce an element capacitance that offsets a parasitic capacitance in a volume surrounding the first input resistance.

19 Claims, 12 Drawing Sheets

FEED FORWARD COMPENSATION OF PARASITIC CAPACITANCE IN A DEVICE FRONTEND

BACKGROUND

Technical Field

This application is directed to a feed forward compensation and, in particular, feed forward compensation of parasitic capacitance in a frontend of a measurement device.

Description of the Related Art

Parasitic capacitance is observed between circuit components of a measurement device. The parasitic capacitance leads to crosstalk between measurement channels and gain roll-off at high frequencies. Generally, the effects of the parasitic capacitance are positively correlated with the impedance of a circuit. Parasitic capacitance is detrimental in high-voltage measurement devices, such as power quality analyzers, due to the fact that the frontends of the devices have a high impedance. The high impedance is implemented for limiting current draw and power dissipation and for providing an accurate measurement of power line fluctuations. The accuracy of measurement is improved when both a wide and flat frequency response is obtained.

BRIEF SUMMARY

In at least one aspect of the present disclosure, a frontend of a measurement device includes a circuit board and a first input resistance, coupled between an input node and a tap node, positioned on the circuit board. The first input resistance has a length. The frontend includes a feed forward element positioned along at least a portion of the length of the first input resistance and a distance away from the first input resistance. In an embodiment, the feed forward element is operative to introduce an element capacitance that offsets a parasitic capacitance in a volume surrounding the first input resistance.

In an embodiment, the feed forward element is funnel-shaped. In an embodiment, the feed forward element is a metallic plate and has a width that is increasing along the at least a portion of the length of the first input resistance. In an embodiment, the first input resistance is a plate having an interwinding serpentine or etched trace resistance and the feed forward element is a metallic plate. In an embodiment, the frontend includes a shield, surrounding the first input resistance, operative to induce the parasitic capacitance. In an embodiment, a width of the feed forward element at a point along the at least a portion of the length of the first input resistance is determined based on a capacitance ratio of the element capacitance to the parasitic capacitance at the point along the length of the first input resistance.

In an embodiment, the capacitance ratio is firstly proportional to or positively correlated with a first portion of the first input resistance up to the point along the length of the first input resistance and secondly inversely proportional to or negatively correlated with a second portion of the first input resistance after the point. In an embodiment, the frontend includes a second input resistance coupled to the tap node and operative to form a voltage divider with the first input resistance such that an input voltage supplied at the input node is divided and a divided voltage is provided at the tap node. In an embodiment, the feed forward element is coupled to the tap node.

In another aspect of the present disclosure, a measurement device includes a frontend including a circuit board and a first input resistance, coupled between an input node and a tap node, positioned on the circuit board. The first input resistance has a length. In an embodiment, the frontend includes a feed forward element positioned along at least a portion of the length of the first input resistance and a distance away from the first input resistance. In an embodiment, the feed forward element is operative to introduce an element capacitance that offsets a parasitic capacitance in a volume surrounding the first input resistance. In an embodiment, the measurement device includes circuitry, coupled to the tap node, configured to detect a first signal at the tap node representative of an input signal at the input node and determine at least one electrical quantity of the input signal.

In an embodiment, the feed forward element is funnel-shaped. In an embodiment, the feed forward element is a metallic plate and has a width that is increasing along the at least a portion of the length of the first input resistance. In an embodiment, the width of the feed forward element at a point along the at least a portion of the length of the first input resistance is determined based on a capacitance ratio of the element capacitance to the parasitic capacitance at the point along the length of the first input resistance.

In an embodiment, the input signal is a high voltage input signal. In an embodiment, the first input resistance is a plate having an interwinding serpentine or etched trace resistance and the feed forward element is a metallic plate. In an embodiment, the measurement includes a shield, surrounding the first input resistance, operative to induce the parasitic capacitance. In an embodiment, the measurement device includes a second input resistance coupled to the tap node and operative to form a voltage divider with the first input resistance such that the input signal supplied at the input node is divided and a divided signal is provided at the tap node. In an embodiment, the feed forward element is coupled to the tap node.

In yet another aspect of the present disclosure, a method includes inducing an element capacitance between a first input resistance and a feed forward element positioned along at least a portion of a length of the first input resistance, where the first input resistance is coupled between an input node and a tap node, the feed forward element is positioned a distance away from the first input resistance. In an embodiment, the method includes offsetting, using the element capacitance, a parasitic capacitance in a volume surrounding the first input resistance.

In an embodiment, the feed forward element is funnel-shaped. In an embodiment, the feed forward element is a metallic plate and has a width that is increasing along the at least a portion of the length of the first input resistance.

DETAILED DESCRIPTION

Compensating a parasitic capacitance in a frontend of a measurement device, such as a high-impedance voltage measurement device or a high-voltage power quality analyzer, is provided herein. Compensating the parasitic capacitance flattens and extends a frequency response of the frontend resulting in improving an accuracy of measurements made by the measurement device. Crosstalk between channels of the frontend may be mitigated by separating channels using a shield, whereby the shield may be a grounded guard plate. However, use of the shield increases parasitic capacitance to ground and reduces channel bandwidth.

As described herein, parasitic capacitance is mitigated by adding a conductive plate that is sized and dimensioned to redirect the parasitic capacitance to a forward summing node. The conductive plate offsets the parasitic capacitance resulting in a flat frequency response with high bandwidth.

Figure 1:
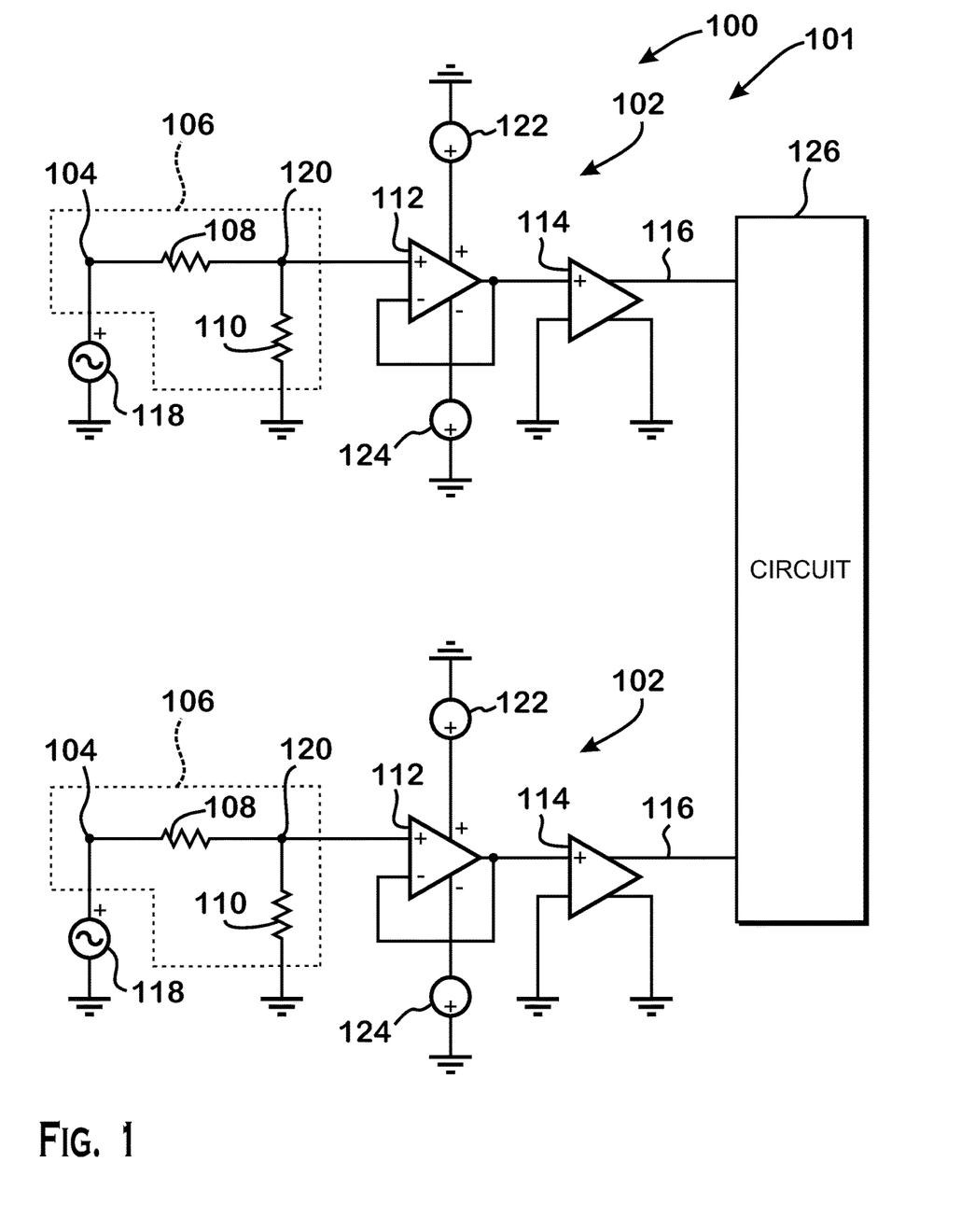
FIG. 1 shows a circuit schematic of one example of a frontend of a measurement device.

FIG. 1 shows a circuit schematic of one example of a frontend 100 of a measurement device 101. The frontend 100 includes a plurality of channels 102 of which two channels are illustrated. For example, the measurement device 101 may be a voltage measurement device or power quality analyzer, among other measurement devices. Each channel of the plurality of channels may each have the same structure. Further, the plurality of channels may receive and relay different signals. For example, the frontend 100 may have three channels respectively associated with three phases of an alternating current (AC) voltage. Alternatively, for this example, the frontend 100 may have four channels of which three channels are respectively associated with the three phases of the AC voltage and one channel is associated with a neutral line.

A channel 102 includes an input node 104, a voltage divider 106 including first and second input resistances 108, 110, an operational amplifier 112, a fully differential amplifier 114, and an output node 116. The input node 104 is coupled during operation to a voltage source 118 to be measured. The voltage source 118 may have high impedance or high voltage.

A tap node 120 of the voltage divider 106 is coupled to a first input of the operational amplifier 112. A second input of the operational amplifier 112 is coupled to an output of the operational amplifier 112. The first and second inputs of the operational amplifier 112 may be noninverting and inverting inputs, respectively. The operational amplifier 112 has first and second supply nodes respectively coupled to first and second supply voltage sources 122, 124.

The fully differential amplifier 114 has a first input coupled to the output of the operational amplifier 112. The fully differential amplifier 114 has a second input coupled to ground. The fully differential amplifier 114 has a first output coupled to the output node 116. The fully differential amplifier 114 has a second output coupled to ground.

The output node 116 of the channel 102 is coupled to a circuit 126 of the measurement device 101. The circuit 126 may perform analog-to-digital conversion among other processing for determining an electrical quantity of a signal output by the voltage source 118, such as a voltage level, among others. The circuit 126 may output the determined electrical quantity to an output device (not shown). For example, the output device may be a display that displays an indication of the electrical quantity to a user.

Figure 2:
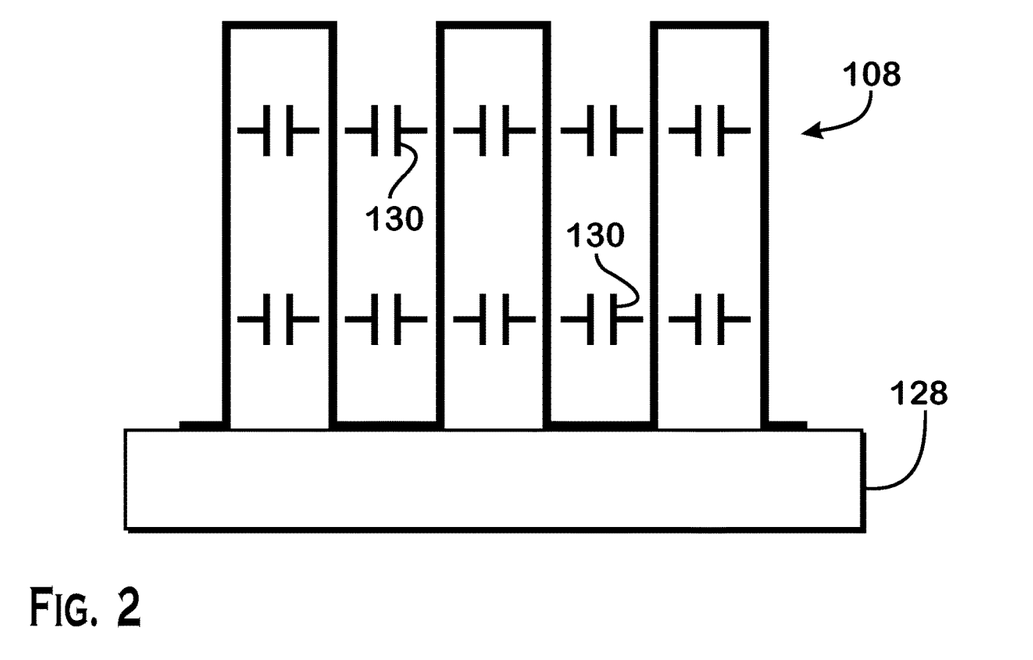
FIG. 2 shows a side view of a first input resistance positioned on a printed circuit board in accordance with an embodiment of the present disclosure.

FIG. 2 shows a side view of the first input resistance 108 positioned on a printed circuit board (PCB) 128 in accordance with an embodiment. The first input resistance 108 may be an interwinding serpentine or etched trace resistance in the form of a plate. The first input resistance 108, when positioned on the printed circuit board 128 has traces that are transverse to a plane of the printed circuit board 128. The parasitic effects of the frontend 100 include an interwinding capacitance 130 observed between the traces of the first input resistance 108.

Figure 3:
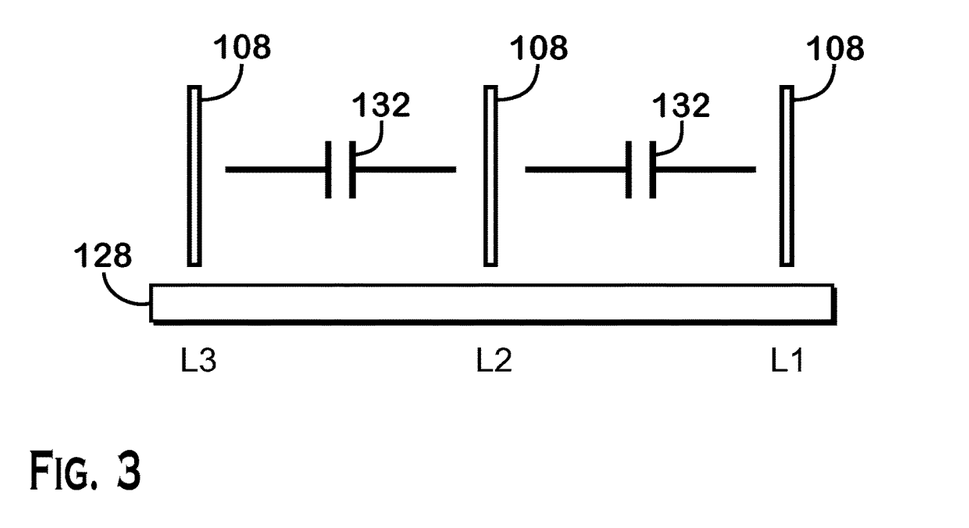
FIG. 3 shows a front view of the first input resistances of three channels, respectively, positioned on the printed circuit board in accordance with an embodiment.

FIG. 3 shows a front view of the first input resistances 108 of three channels 102 labeled L1, L2, and L3, respectively, positioned on the printed circuit board 128 in accordance with an embodiment. Positioning the plates of the first input resistances 108 of the three channels 102 physically parallel to each other creates a parasitic air-gap capacitance or parasitic crosstalk 132 between the respective channels 102. To mitigate the parasitic effects between the plates, a shield is placed surrounding the first input resistances 108.

Figure 4:
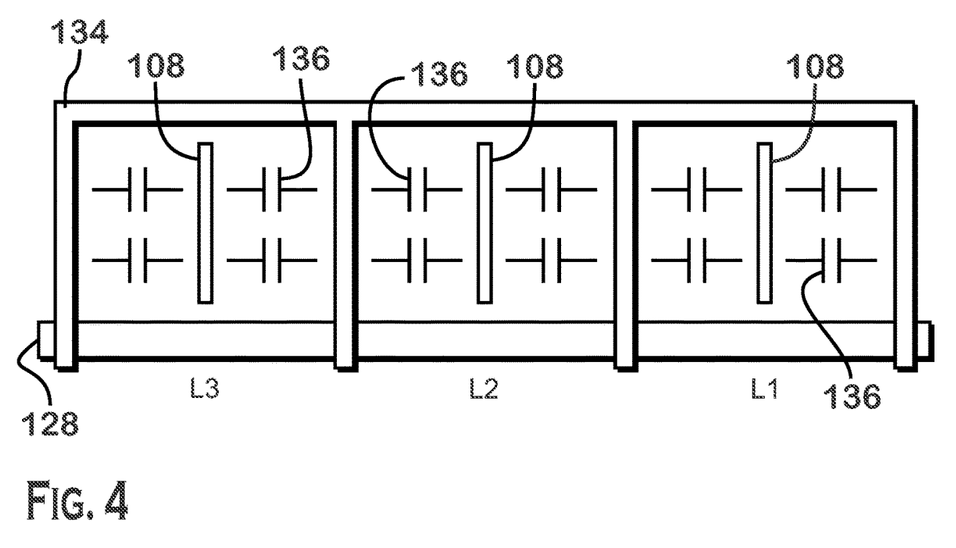
FIG. 4 shows a front view of the first input resistances of three channels, respectively, positioned on the printed circuit board and surrounded by a shield in accordance with an embodiment.

FIG. 4 shows a front view of the first input resistances 108 of the three channels 102 of FIG. 3, respectively, positioned on the printed circuit board 128 and surrounded by a shield 134 in accordance with an embodiment. The shield 134 mitigates crosstalk. However, the shield 134 introduces a parasitic capacitance 136 between the first input resistances 108 (or plates thereof) and the shield 134. A feed forward element is used to mitigate the parasitic capacitance 136.

Figure 5:
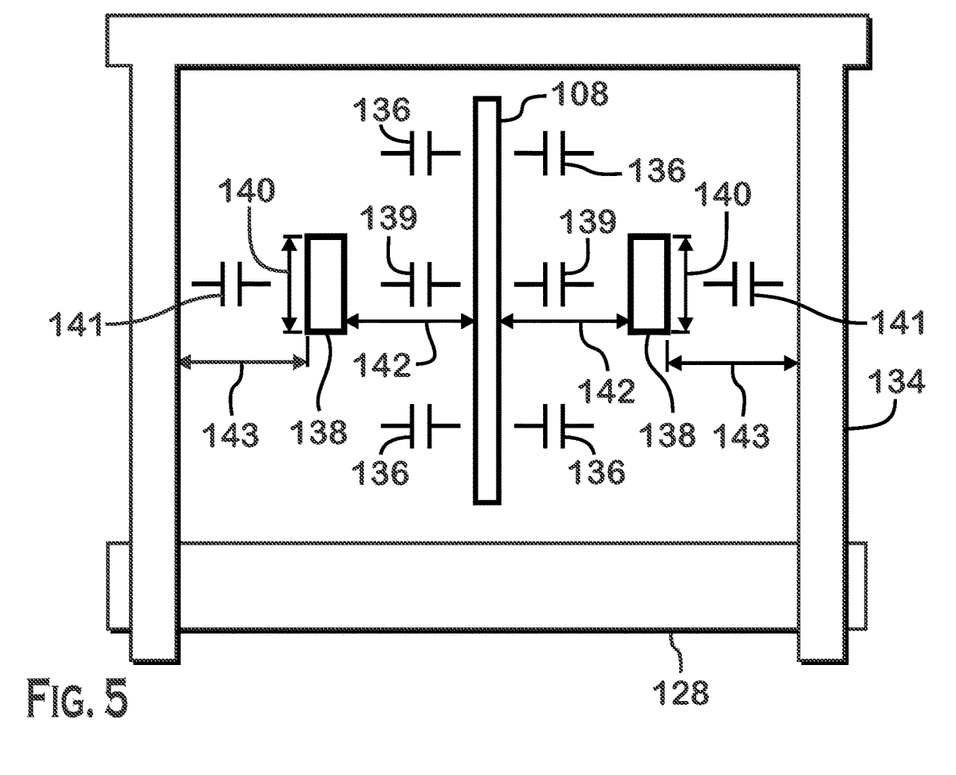
FIG. 5 shows a front view of the first input resistance of a channel surrounded by a shield and having an intervening feed forward element in accordance with an embodiment.

FIG. 5 shows a front view of the first input resistance 108 of a channel 102 surrounded by a shield 134 and having an intervening feed forward element 138 in accordance with an embodiment. The feed forward element 138 is positioned between the first input resistance 108 and the shield 134. The feed forward element 138 intercepts part of the electric field in the volume between the first input resistance 108 and the shield 134 and reduces the capacitance between the first input resistance 108 and the shield 134. In the absence of the feed forward element 138, an electric field directly capacitively couples the first input resistance 108 to the shield 134. Positioning the feed forward element 138 between the first input resistance 108 and the shield 134 allows the feed forward element 138 to intercept and reduce the electric field.

As shown in FIG. 5, the parasitic capacitance 136 between the first input resistance 108 and the shield 134 is present. Additionally, the addition of the feed forward element 138 introduces an element capacitance 139 between the first input resistance 108 and the feed forward element 138 and a shield capacitance 141 between the feed forward element 138 and the shield 134.

The feed forward element 138 may be an electrically conductive plate that is sized and dimensioned to induce the element capacitance 139. The element capacitance 139 is between a plate of the first input resistance 108 and the plate of the feed forward element 138. The feed forward element 138 may be made of any conductive material or metal, such as copper.

Increasing a width 140 (or size) of the feed forward element 138 results in increasing the element capacitance 139. Further, increasing the width 140 of the feed forward element 138 results in decreasing the coupling between the first input resistance 108 and the shield 134 and thereby decreasing the parasitic capacitance 136. Similarly, decreasing a distance 142 between the first input resistance 108 and the feed forward element 138 (or increasing a distance 143 between the feed forward element 138 and the shield 134) also results in increasing the element capacitance 139 and decreasing the parasitic capacitance 136.

The first input resistance 108 described with reference to FIG. 2 may be modeled to determine properties of the feed forward element 138. The properties of the feed forward element 138 (circuit geometry) include the width 140 and the distance 142. For example, the first input resistance 108 may be modeled as a plurality of resistances that are serially-coupled and that span a length of the first input resistance 108.

Figure 6:
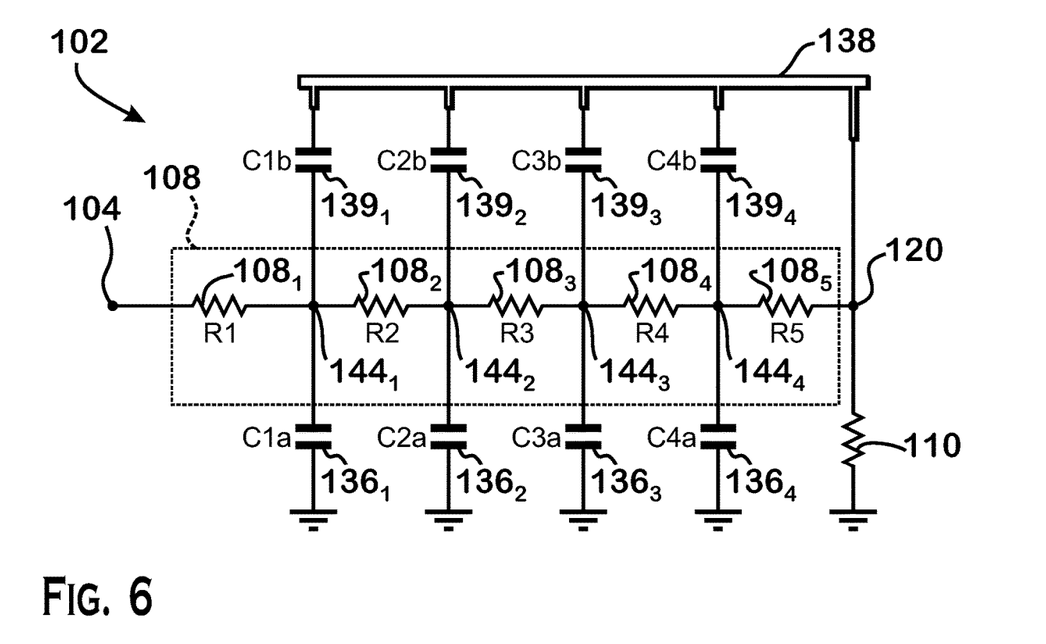
FIG. 6 shows an example of a model of the first input resistance.

FIG. 6 shows an example of a model of the first input resistance 108. The first input resistance 108 is modeled as first, second, third, fourth and fifth resistances $108_1$, $108_2$, $108_3$, $108_4$, $108_5$ coupled in series. In this example, the total number of resistances (N) is five. In the channel 102, the first resistance $108_1$ is coupled between the input node 104 and a first intermediary node $144_1$, the second resistance $108_2$ is coupled between the first intermediary node $144_1$ and a second intermediary node $144_2$, the third resistance $108_3$ is coupled between the second intermediary node $144_2$ and a third intermediary node $144_3$, the fourth resistance $108_4$ is coupled between the third intermediary node $144_3$ and a fourth intermediary node $144_4$, and the fifth resistance $108_5$ is coupled between the fourth intermediary node $144_1$ and the tap node 120. The resistances $108_{1-5}$ may have the same resistance values. The feed forward element 138 is positioned along at least a portion of the length of the first input resistance 108 at a distance from the first input resistance 108. The feed forward element 138 is electrically coupled to the tap node 120.

The element capacitance 139 between the first input resistance 108 and the feed forward element 138 may be modeled as a plurality of element capacitances $139_{1-4}$ coupled between the feed forward element 138 and the plurality of intermediary nodes $144_{1-4}$, respectively. The parasitic capacitance 136 between the first input resistance 108 and the shield 134 may be modeled as a plurality of parasitic capacitances $136_{1-4}$ coupled between the shield 134 (represented as a ground in FIG. 6) and the plurality of intermediary nodes $144_{1-4}$, respectively.

Denoting for an index i the element capacitance $139_i$ as Cib, the parasitic capacitance $136_i$ as Cia and the resistance $108_i$ as Ri, a Fast Analytical Circuits Technique (FACT) may be used to determine a ratio between the element capacitance $139_i$ and the parasitic capacitance $136_i$. Nodal analysis may be used to determine corresponding pole-zero maps. The ratio may be used to provide a zero that cancels a pole attributed to the parasitic capacitance $136_i$.

The pole frequency for an intermediary node $144_i$ having the index i is:

$$\omega_{pole} = \frac{1}{Cia \sum_{j=1}^{i} R_j}. \qquad \text{Equation (1)}$$

The zero frequency for the intermediary node $144_i$ is:

$$\omega_{zero} = \frac{1}{Cib \sum_{j=i+1}^{N} R_j}. \qquad \text{Equation (2)}$$

The pole offsets (or cancels) the zero when they have the same frequency, that is when:

$$\omega_{pole} = \omega_{zero} \qquad \text{Equation (3)}$$

$$\frac{1}{Cia \sum_{j=1}^{i} R_j} = \frac{1}{Cib \sum_{j=i+1}^{N} R_j}$$

$$Cia \sum_{j=1}^{i} R_j = Cib \sum_{j=i+1}^{N} R_j$$

$$\frac{Cib}{Cia} = \frac{\sum_{j=1}^{i} R_j}{\sum_{j=i+1}^{N} R_j}.$$

Assuming the resistances $108_j$ ($R_j$) for j=1, 2, ..., N are equal, then the capacitance ratio of the element capacitance $139_i$ (Cib) to the parasitic capacitance $136_i$ (Cia) is:

$$\frac{Cib}{Cia} = \frac{\sum_{j=1}^{i} 1}{\sum_{j=i+1}^{N} 1} = \frac{i}{N-i}. \qquad \text{Equation (4)}$$

Approximately, Equation (4) indicates that the capacitance ratio at a point along the first input resistance 108 is a ratio of: (i) a first portion of the first input resistance 108 up to the point, and (ii) a second portion of the first input resistance 108 after the point. The capacitance ratio is one near midway along the length of the first input resistance 108. The capacitance ratio approaches zero at a first end (input end) of the first input resistance 108. The capacitance ratio approaches a high value or an infinite value at a second end (output end) of the first input resistance 108.

The capacitance ratio of Equation (4) results in flattening the frequency response. When N is five, the capacitance ratio at the first intermediary node $144_1$ is 1/4, the capacitance ratio at second intermediary node $144_2$ is 2/3, the capacitance ratio at the third intermediary node $144_3$ is 3/2 and the capacitance ratio at the fourth intermediary node $144_4$ is 4. The capacitance ratio increases along the length of the first input resistance 108. The capacitance ratio is determined for discrete points along the modeled resistances $108_i$. The capacitance ratio may be extrapolated for a continuous length of the first input resistance 108.

Figure 7:
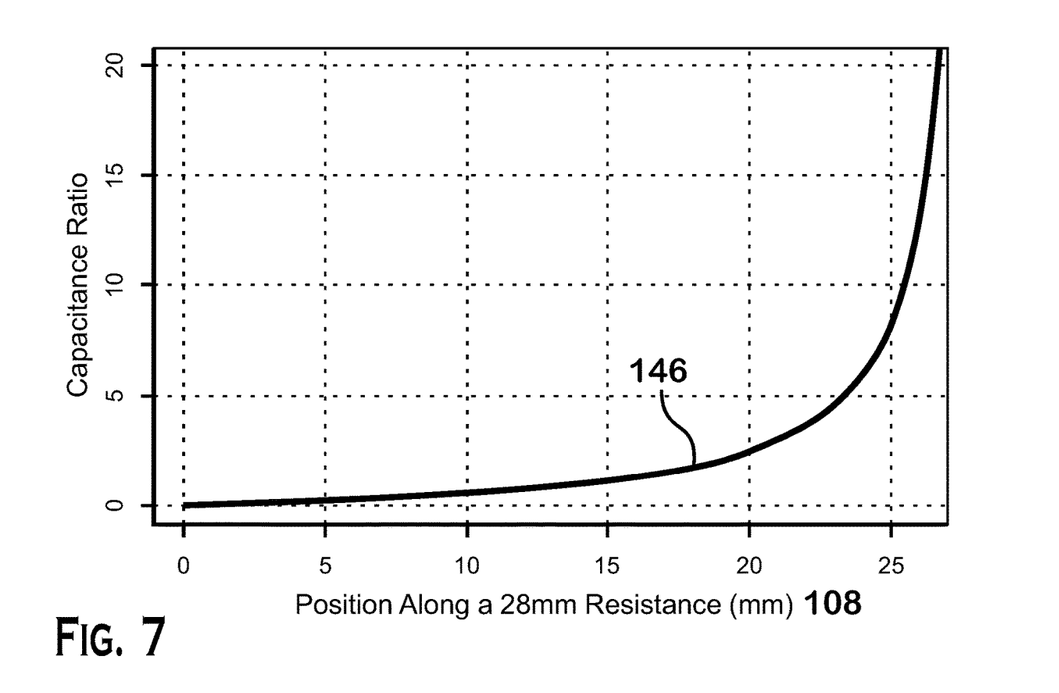
FIG. 7 shows a graph of the capacitance ratio along the length of the first input resistance.

FIG. 7 shows the capacitance ratio 146 along the length of one example of the first input resistance 108. In this example, the first input resistance 108 has a length of 28 millimeters (mm). The capacitance ratio is near zero at the input node 104. As a result, no coupling with the feed forward element 138 is sought at the input node 104 for pole-zero offset. The capacitance ratio increases to higher values over the length of the resistance 108. The capacitance ratio reaches a high value at the tap node 120. Thus, the capacitance ratio specifies that the feed forward element 138 is to nearly completely shield the resistance 108 at the tap node 120 to achieve the pole-zero offsetting.

The element capacitance 139 and the parasitic capacitance 136 may be determined using Finite Element Analysis (FEA) based on circuit geometry (the width 140 of the feed forward element 138 and the distance 142 between the feed forward element 138 and the resistance 108, as described with regard to FIG. 5).

Figure 8:
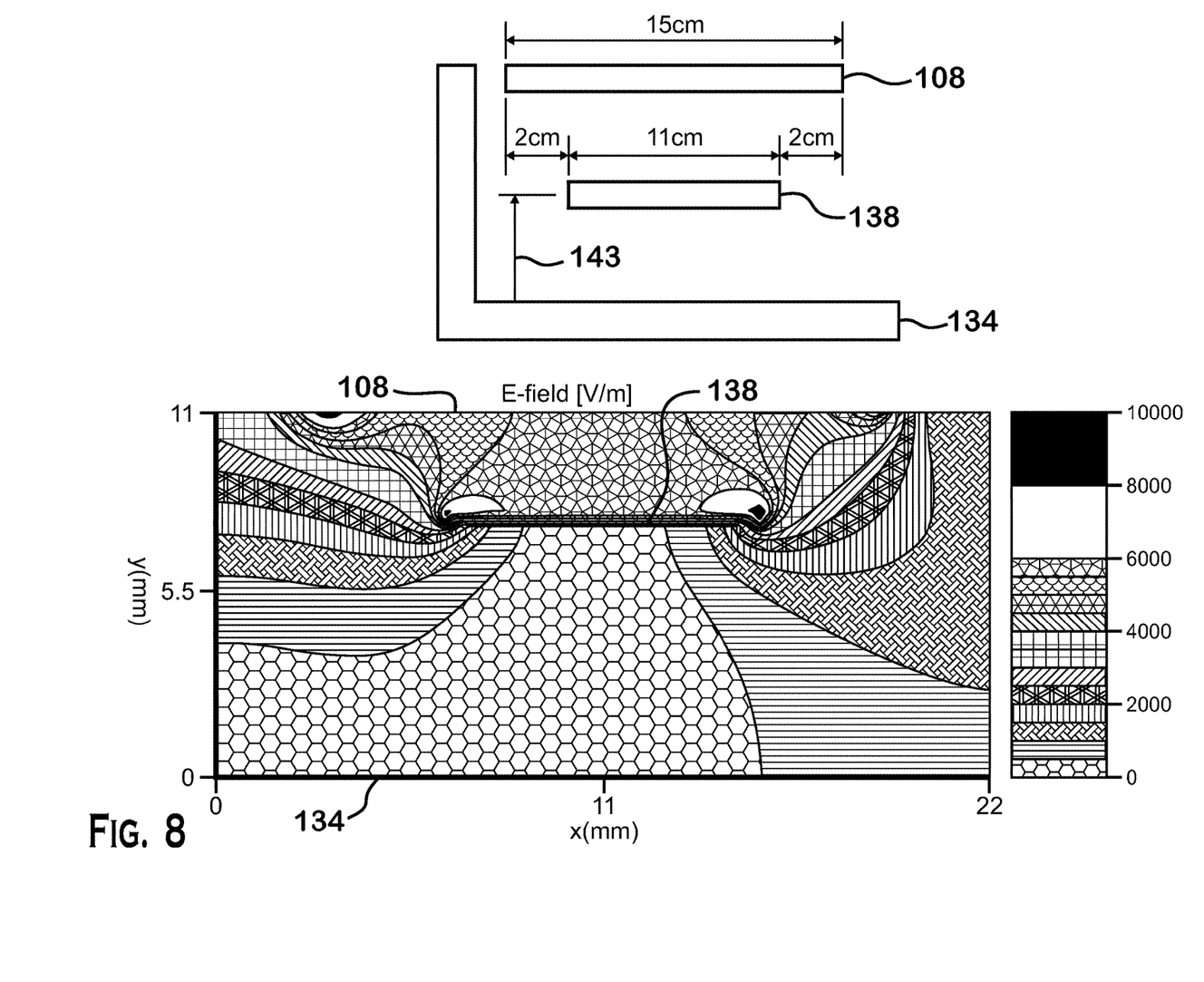
FIG. 8 shows a representation of the circuit geometry of the channel and surrounding electric field.

FIG. 8 shows a representation of the circuit geometry of the channel 102 and surrounding electric field. The electric field is in units of volts per meter (V/m). In this example, a length of the first input resistance 108 is 15 centimeters (cm) and a length of the feed forward element 138 is 11 cm. The feed forward element 138 is centered along a length of the resistance 108 and displaced from the resistance 108.

The electric potential ($\Psi$) in the circuit may be determined using the Laplace equation as:

$$\nabla^2 \Psi = 0 \quad \text{Equation (5),}$$

where $\nabla^2$ represents the Laplace operator.

The electric field (E) is determined using the gradient operator ($\nabla$) from the electric potential ($\Psi$) as:

$$E = -\nabla \cdot \Psi \quad \text{Equation (6).}$$

The displacement field (D) is determined as:

$$D = \varepsilon \cdot E \quad \text{Equation (7),}$$

where $\varepsilon$ denotes environmental permittivity.

The surface charge density of the feed forward element 138 or the shield 134 is:

$$\rho_s = \nabla \cdot D \quad \text{Equation (8).}$$

The element capacitance 139 and the parasitic capacitance 136 are determined from the total surface charge of the feed forward element 138 and the shield 134 and the capacitance voltage ($V_{cap}$), respectively, as:

$$C = \Sigma \rho s / V_{cap} \quad \text{Equation (9).}$$

As illustrated in FIG. 8, the feed forward element 138 reduces the parasitic capacitance 136 by drawing the electric field from the resistance 108 away from the shield 134 and pulling the electric field toward the feed forward element 138.

Figure 9A:
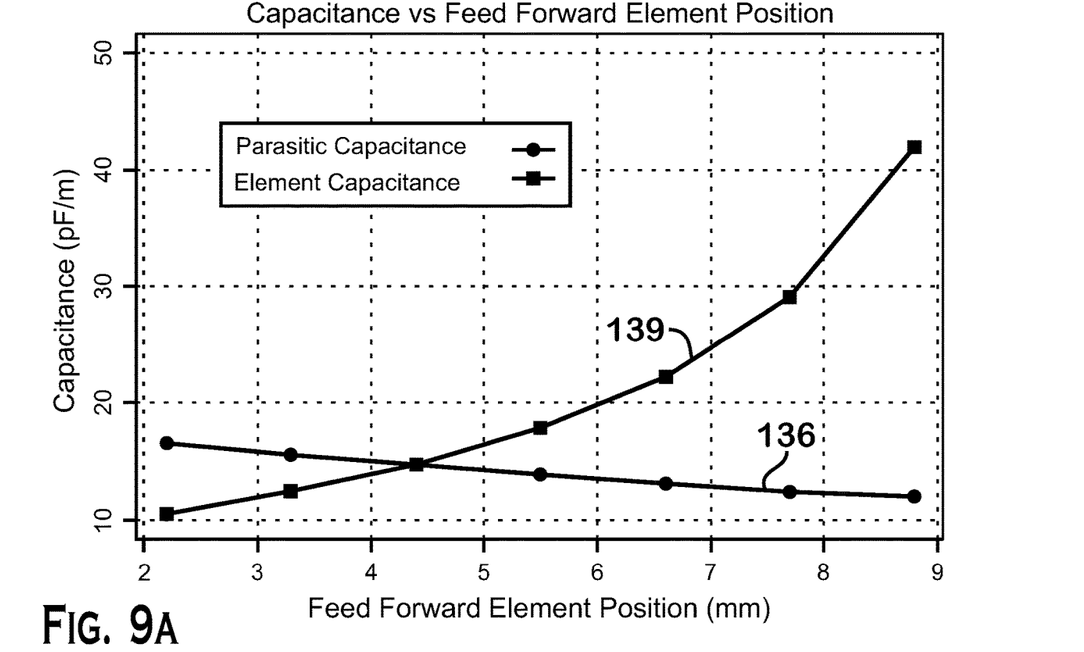
FIG. 9A shows a graph depicting a relationship between the element and parasitic capacitances and the distance between the feed forward element and the shield.
Figure 9B:
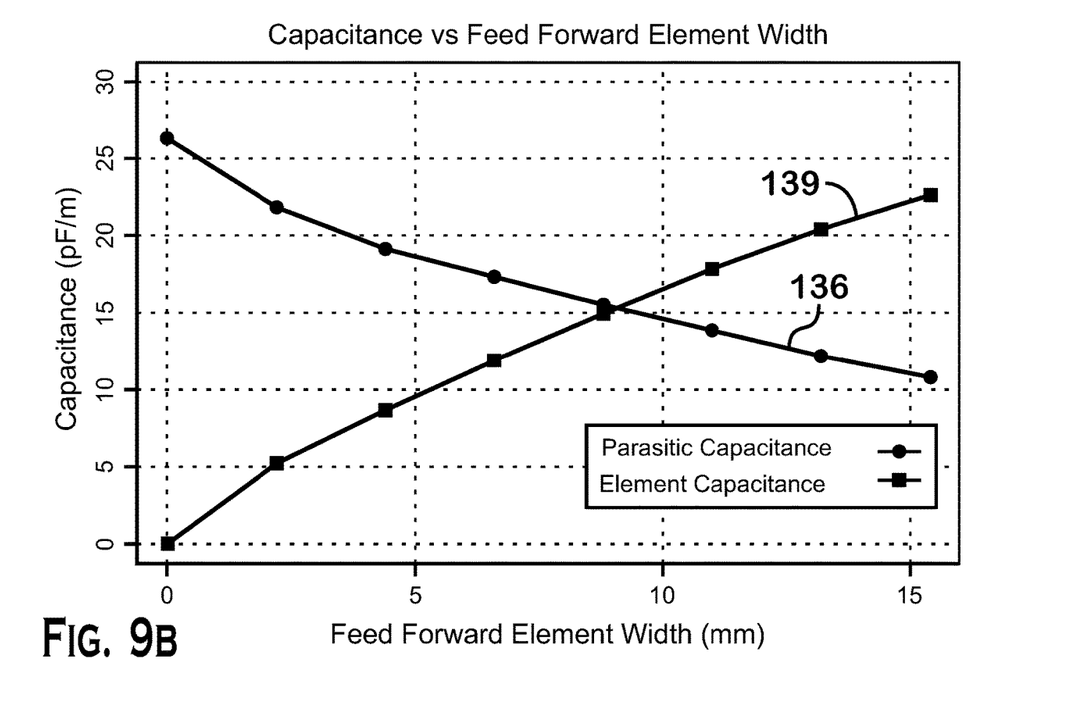
FIG. 9B shows a graph depicting a relationship between the element and parasitic capacitances and the width of the feed forward element.

FIG. 9A shows a relationship between the element capacitance 139 and the parasitic capacitance 136 and the distance 143 between the feed forward element 138 and the shield 134. FIG. 9B shows a relationship between the element capacitance 139 and the parasitic capacitance 136 and the width 140 of the feed forward element 138. By adjusting the distance 143 and the width 140, a desired capacitance ratio is determined. The feed forward element 138 may run parallel to the resistance 108 and may be separated by the same distance 142 (e.g., 2 mm) over the length of the resistance.

Figure 10:
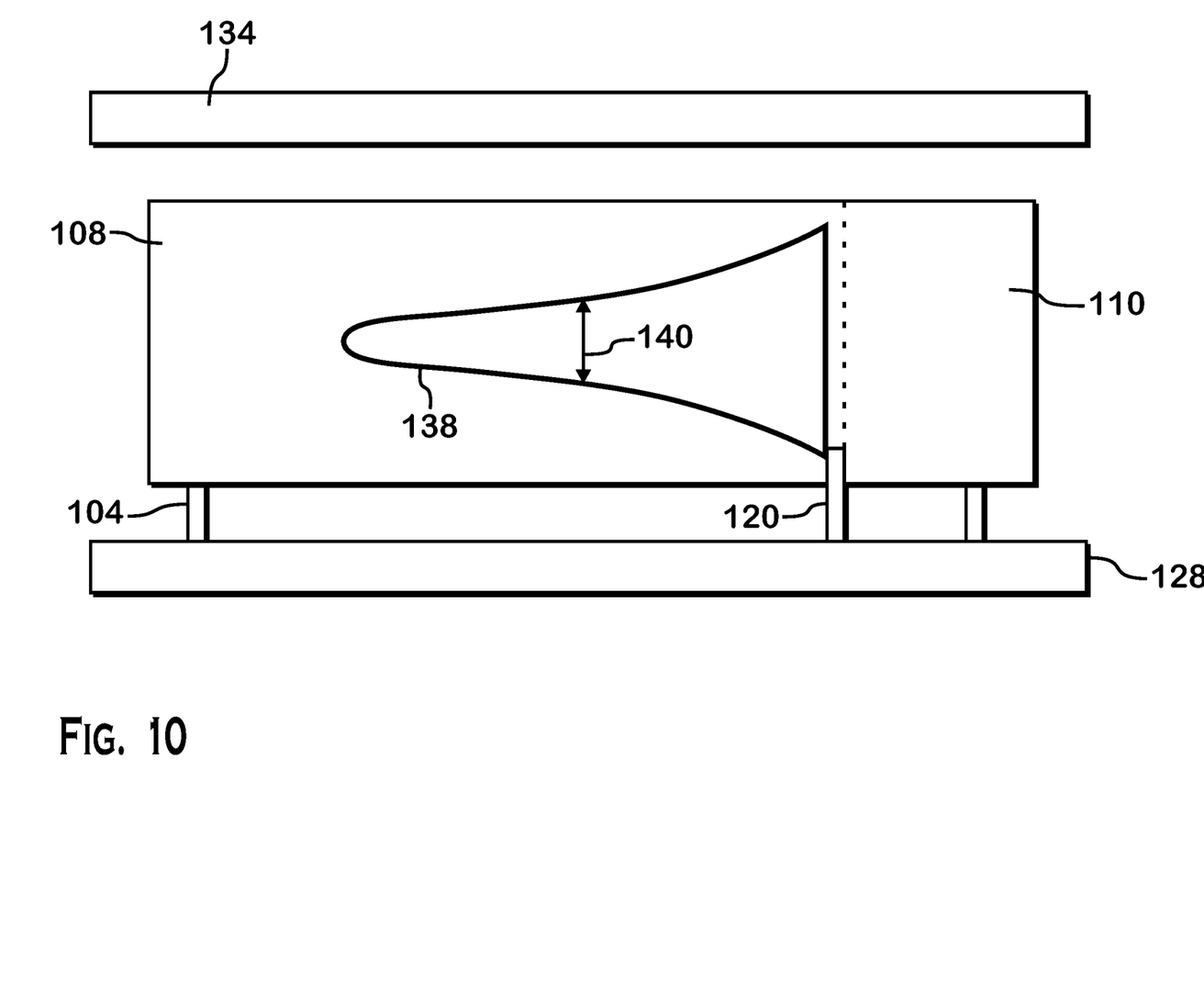
FIG. 10 shows a side view of the resistance and the feed forward element according to an embodiment.

FIG. 10 shows a side view of the resistance 108 and the feed forward element 138 according to an embodiment. The distance 142 between the feed forward element 138 and the resistance 108 is the same along the length of the feed forward element 138. Accordingly, the feed forward element 138 has an increasing width 140 from the input node 104 to the tap node 120 along the length of the resistance 108. Per the capacitance ratio of FIG. 7 and Equation (4), the width 140 of the feed forward element 138 increases (e.g., in an exponential manner) along the length of the resistance 108. The increasing width results in increasing the capacitance ratio. The width 140 may be determined using the described FEA simulations to meet the capacitance ratio determined by the FACT analysis of Equation (4).

The width 140 of the feed forward element 138 may be increasing along the length of the first input resistance 108 or the width 140 of the feed forward element 138 may be positively correlated or proportional to the distance to the input node 104. The width 140 of the feed forward element 138 at a point may be positively correlated with or proportional to a first distance from the input node 104 to the point. The width 140 of the feed forward element 138 at the point may be negatively correlated with or inversely proportional to a second distance from the point to the tap node 120. The feed forward element 138 may be funnel-shaped or may be tapered or curved. Further, the feed forward element 138 may be cone-shaped such that the element capacitance 139 induced by the feed forward element 138 increases along the length of the first input resistance 108 (from the input node 104 to the tap node 120). The feed forward element 138 may be said to compensate in a "parasitic manner" the frequency response of the first input resistance 108.

Figure 11:
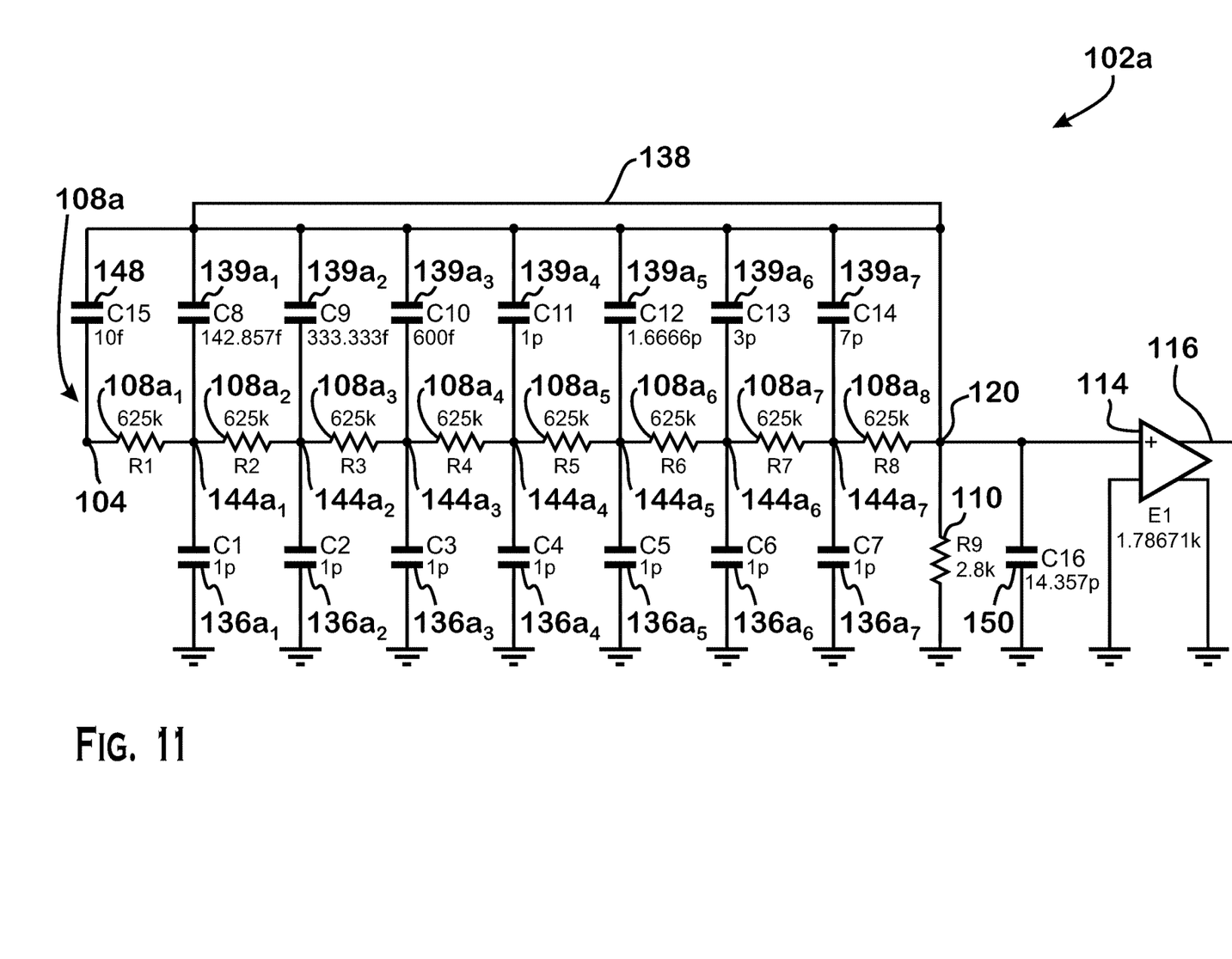
FIG. 11 shows a circuit schematic of a channel in accordance with an embodiment.

FIG. 11 shows a channel $102a$ in accordance with an embodiment. The first input resistance $108a$ is modeled as eight (N=8) equivalued resistances $108a_{1-8}$. The feed forward element 138 is positioned at a distance from the first input resistance $108a$ and is coupled to the tap node 120. The element capacitance $139a$ between the first input resistance $108a$ and the feed forward element 138 is modeled as seven element capacitances $139a_{1-7}$ between the feed forward element 138 and seven intermediary nodes $144a_{1-7}$, respectively. The parasitic capacitance 136 between the first input resistance 108 and the shield 134 is modeled as seven parasitic capacitances $136a_{1-7}$ coupled between the shield 134 and the seven intermediary nodes $144a_{1-7}$, respectively. The element capacitances $139a_{1-7}$ are determined based on the capacitance ratio, where the element capacitances $139a_{1-7}$ increase exponentially according to Equation (4).

An input capacitance 148 is represented between an input jack (not shown) and the feed forward element 138. A compensating capacitance 150 is coupled between the tap node 120 and ground. The compensating capacitance 150 compensates for the input capacitance 148.

Figure 12A:
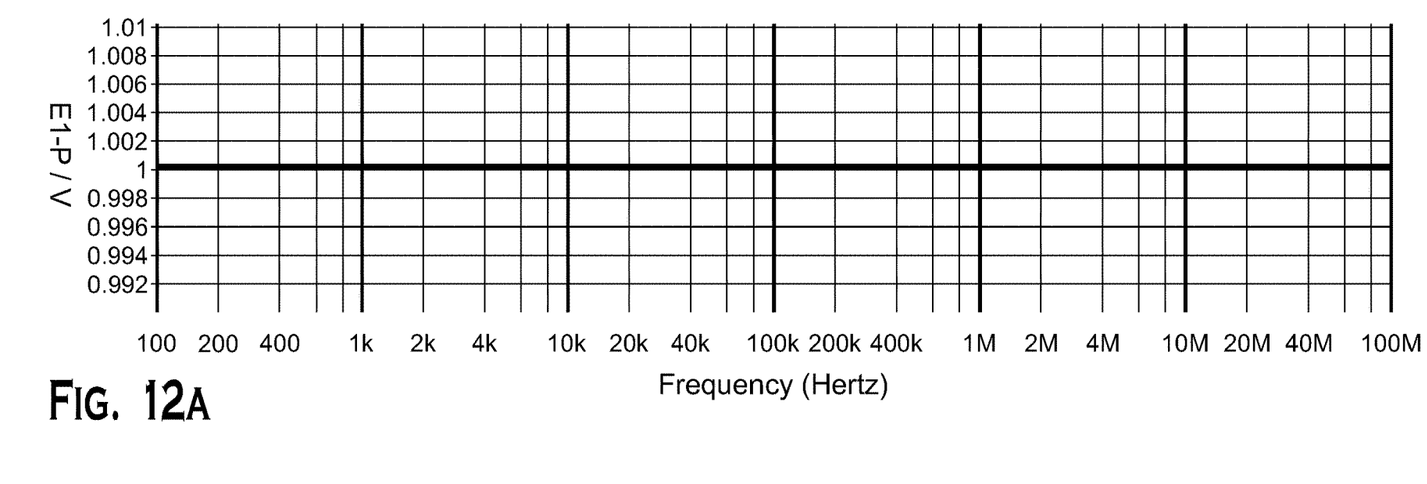
FIGS. 12A-D show graphs depicting frequency responses of the channel of FIG. 11.

FIGS. 12A-D show frequency responses of the channel $102a$ of FIG. 11. In the frequency response, the x-axis represents the frequency and the y-axis represents a ratio between the voltage at the output node 116 and the voltage at the input node 104. FIG. 12A shows the frequency response for the channel $102a$ when the feed forward element 138 is dimensioned to meet the capacitance ratios shown in FIG. 11 (determined according to Equation (4)).

Per FIG. 12A, the frequency response is flat between 100 Hertz (Hz) and 100 megahertz (MHz).

Figure 12B:
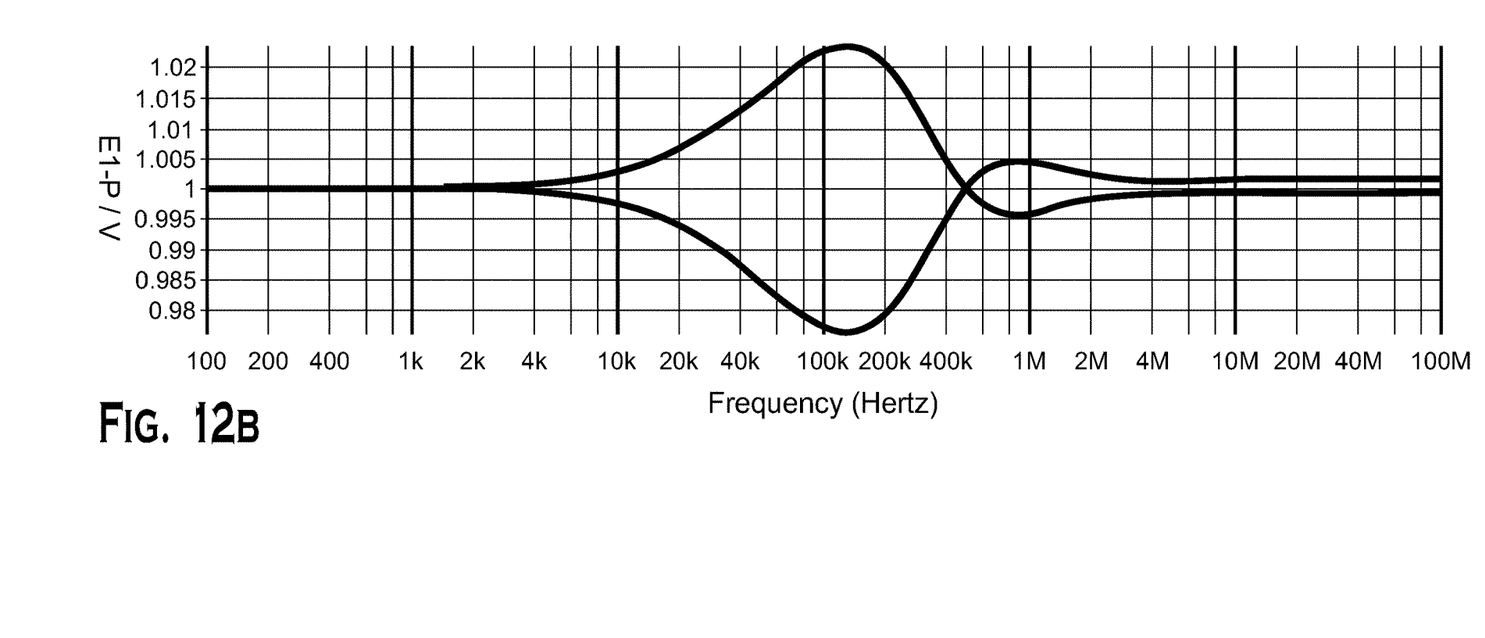
Figure 12C:
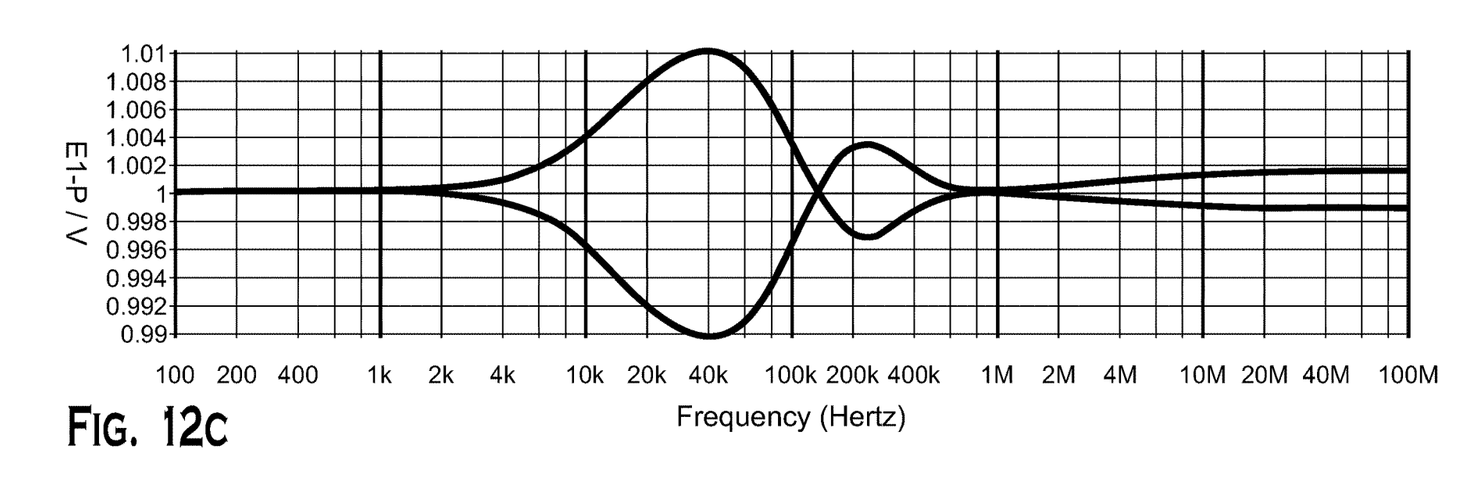
Figure 12D:
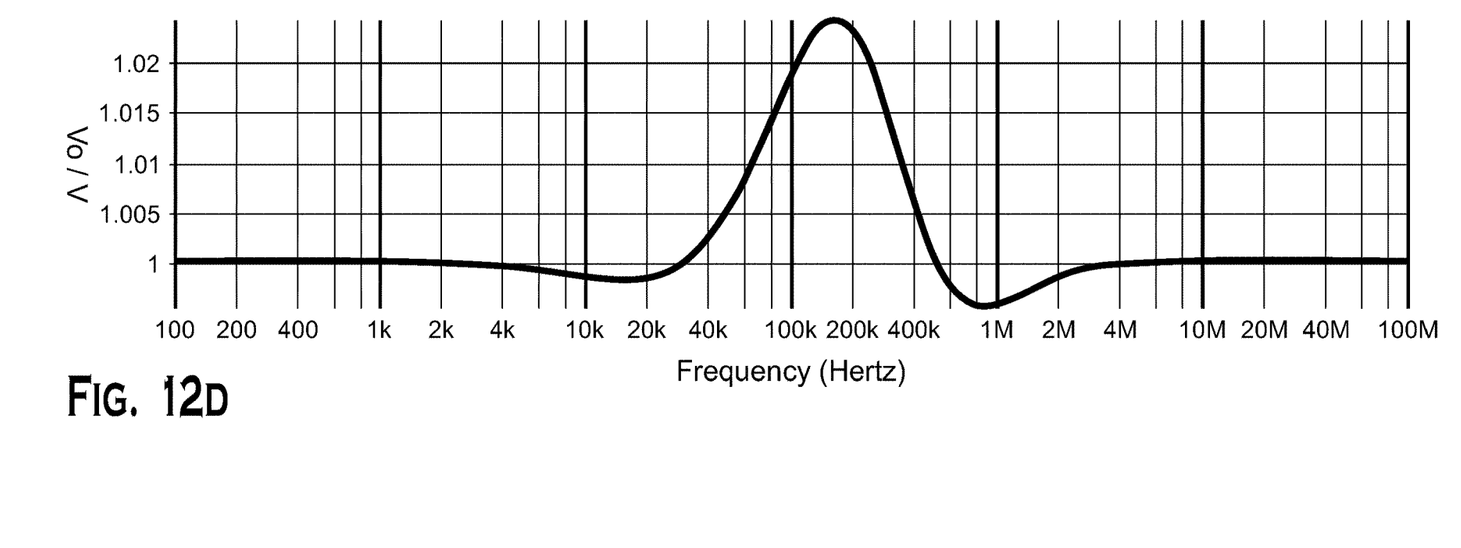

FIG. 12B shows the frequency response for the channel 102a when the fifth element capacitance $139a_5$ diverges by +/−10% from the capacitance value indicated by the capacitance ratio. FIG. 12C shows the frequency response for the channel 102a when the third element capacitance $139a_3$ diverges by +/−10% from the capacitance value indicated by the capacitance ratio. FIG. 12D shows the frequency response for the channel 102a when both the fifth element capacitance $139a_5$ and the third element capacitance $139a_3$ diverge by +/−10% from the capacitance value indicated by the capacitance ratio.

As seen in FIGS. 12A-D, a departure of 10% of the capacitance provided by the feed forward element 138 does not significantly affect the frequency response. The ratio between the voltage at the output node 116 and the voltage at the input node 104 is between 0.97 and 1.03 when the capacitance deviation is 10%. Capacitance deviation may result from misshaping the feed forward element 138 by, for example, departing from the feed forward element 138 having an increasing width 140 or shaping the feed forward element 138 as a cone or funnel. Capacitance deviation may also result from reducing or increasing the distance 142 between the feed forward element 138 and the first input resistance 108. The compensation scheme described herein tolerates departures from shaping the feed forward element 138 as a funnel. However, meeting the capacitance ratio results in a flat or essentially flat frequency response.

Figure 13:
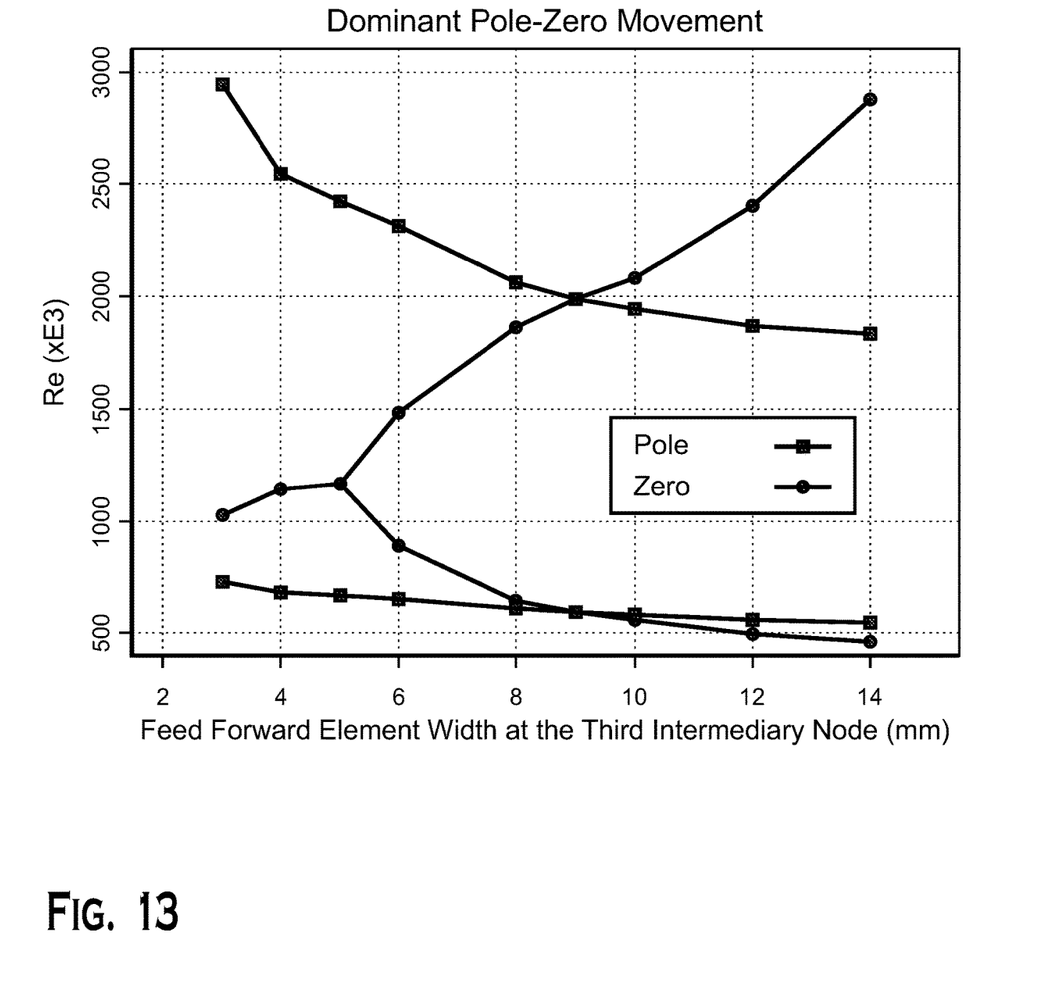
FIG. 13 shows as graph depicting a movement of dominant pole-zero pairs for a channel having the first input resistance modeled as four equivalued resistances.

FIG. 13 shows a movement of dominant pole-zero pairs for a channel 102 having the first input resistance 108 modeled as four (N=4) equivalued resistances. Because the first input resistance 108 is modeled as four (N=4) equivalued resistances, the channel 102 has three intermediary nodes. The third node has an associated capacitance ratio of 3, which corresponds to a width of the feed forward element 138 of 9 mm. FIG. 13 shows that when the feed forward element 138 has a width of 9 mm (satisfying the capacitance ratio of 3), the zeros correspond to and cancel the poles.

If the element capacitance 139 at the third intermediary node diverges from the capacitance ratio, the pole-zero locations of all intermediary node nodes are affected. When the width 140 of the feed forward element 138 is 5 mm or less, the two dominant zeros become complex. When the width 140 is greater than 9 mm, the zero dominates the frequency response and results in frequency peaking and a transient overshoot. The dominant pole-zero pair associated with the second intermediary node experiences a larger frequency shift than the dominant pole-zero pair associated with the third intermediary node. Thus, a misalignment deviating from the capacitance ratio of an intermediary nodes affects all pole-zero pairs along a chain of resistances/nodes.

Figure 14:
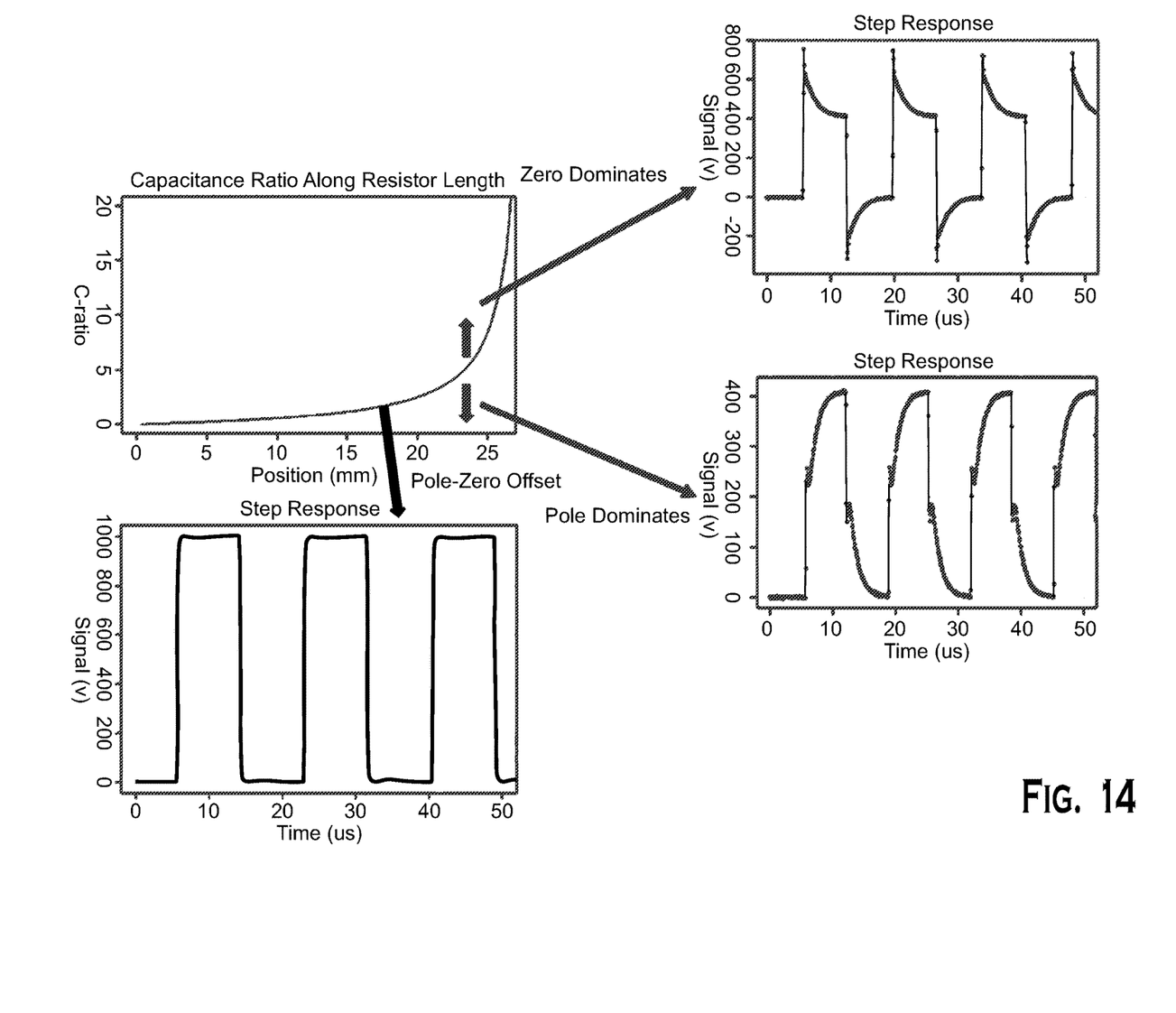
FIG. 14 shows graphs depicting the capacitance ratio along the length of the resistance and associated steps responses.

FIG. 14 shows the capacitance ratio 146 along the length of the first input resistance 108 and associated steps responses. The capacitance ratio indicates the width 140 of the feed forward element 138. If the feed forward element 138 is wider than indicated by the capacitance ratio (i.e., higher than the curve of the capacitance ratio), an overshoot of the step response is observed. That is due to the fact that the zero dominates and a resulting feedforward signal carried by the feed forward element 138 is larger than warranted.

If the feed forward element 138 is narrower than indicated by the capacitance ratio (i.e., lower than the curve of the capacitance ratio), a long rise time is observed due to a dominant pole. Conversely, if the feed forward element 138 corresponds to the width indicated by the capacitance ratio, the step response does not exhibit a significant undershoot or overshoot.

The following examples set forth a variety of features of embodiments described herein, and are grouped for convenience. Embodiments contemplated by the present disclosure may include any of the features, singly or in any combination, described in the following groups of examples. However, these examples and groups of examples are not exhaustive of all the features of embodiments contemplated by the present disclosure that have been described earlier herein.

The first group of examples, set forth as follows, includes a frontend of a measurement device.

In one example, the frontend has a circuit board. In one example, the frontend has a first input resistance. In one example, the first input resistance is coupled between an input node and a tap node. In one example, the first input resistance is positioned on the circuit board and has a length.

In one example, the frontend has a feed forward element. In one example, the feed forward element is positioned along at least a portion of the length of the first input resistance. In one example, the feed forward element is positioned a distance away from the first input resistance. In one example, the feed forward element is operative to introduce an element capacitance. In one example, the element capacitance offsets a parasitic capacitance in a volume surrounding the first input resistance.

In one example, the feed forward element is funnel-shaped.

In one example, the feed forward element is a metallic plate.

In one example, the feed forward element has a width that is increasing along the at least a portion of the length of the first input resistance.

In one example, the first input resistance is a plate having an interwinding serpentine resistance. In one example, the first input resistance is an etched trace resistance.

In one example, the frontend has a shield. In one example, the shield surrounds the first input resistance. In one example, the shield is operative to induce the parasitic capacitance.

In one example, a width of the feed forward element at a point along the at least a portion of the length of the first input resistance is determined based on a capacitance ratio. In one example, the capacitance ratio is between the element capacitance to the parasitic capacitance at the point along the length of the first input resistance.

In one example, the capacitance ratio is positively correlated or proportional to a first portion of the first input resistance up to the point. In one example, the capacitance ratio is negatively correlated or inversely proportional to a second portion of the first input resistance after the point.

In one example, the frontend has a second input resistance coupled to the tap node. In one example, the second input resistance is operative to form a voltage divider with the first input resistance. In one example, an input voltage supplied at the input node is divided. In one example, a divided voltage is provided at the tap node.

In one example, the feed forward element is coupled to the tap node.

The second group of examples, set forth as follows, includes a measurement device. In one example, the measurement device includes a frontend. The frontend may include any feature or combination of features of the frontend described in the first group of examples.

In one example, the frontend includes circuitry. In one example, the circuitry is coupled to the tap node. In one example, the circuitry is configured to detect a first signal at the tap node. In one example, the first signal is representative of an input signal at the input node. In one example, based on the detected first signal, the circuitry is configured to determine at least one electrical quantity of the input signal.

In one example, the input signal is a high voltage input signal.

The third group of examples, set forth as follows, includes a method.

In one example, the method includes inducing an element capacitance between a first input resistance and a feed forward element. In one example, the feed forward element is positioned along at least a portion of a length of the first input resistance. In one example, the first input resistance is coupled between an input node and a tap node. In one example, the feed forward element is positioned a distance away from the first input resistance.

In one example, the method includes offsetting a parasitic capacitance in a volume surrounding the first input resistance. In one example, the method includes using the element capacitance to offset the parasitic capacitance in the volume surrounding the first input resistance.

Any feature or combination of features described in the first group of examples or the second group of examples may be included in the methods according to the third group of examples. For instance, in one example, the first input resistance is a plate having an interwinding serpentine trace resistance. In one example, the first input resistance is a plate having an etched trace resistance. In one example, the feed forward element is a metallic plate. In one example, the method includes inducing the parasitic capacitance between the first input resistance and a shield surrounding the first input resistance.

In one example, a shape of the feed forward element at a point along the length of the first input resistance is determined based on a capacitance ratio of the element capacitance to the parasitic capacitance at the point along the length of the first input resistance. In one example, the feed forward element is coupled to the tap node.

The various examples and embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A frontend of a measurement device, comprising:
   a circuit board;
   a first input resistance coupled between an input node and a tap node and positioned on the circuit board, the first input resistance having a length and being configured to receive an input voltage at the input node and provide a divided voltage at the tap node; and
   a feed forward element coupled to the tap node and positioned along at least a portion of the length of the first input resistance and a distance away from the first input resistance, the feed forward element being operative to introduce an element capacitance that offsets a parasitic capacitance in a volume between the feed forward element and the first input resistance.

2. The frontend of claim 1, wherein the feed forward element is funnel-shaped.

3. The frontend of claim 1, wherein the feed forward element is a metallic plate and has a width that increases along the portion of the length of the first input resistance.

4. The frontend of claim 1, wherein the first input resistance is a plate having an interwinding serpentine or etched trace resistance and the feed forward element is a metallic plate.

5. The frontend of claim 1, further comprising:
   a shield, surrounding the first input resistance, operative to induce the parasitic capacitance.

6. The frontend of claim 1, wherein a width of the feed forward element at a point along the portion of the length of the first input resistance is determined based on a capacitance ratio of the element capacitance to the parasitic capacitance at the point along the length of the first input resistance.

7. The frontend of claim 6, wherein the capacitance ratio is positively correlated to a first portion of the first input resistance up to the point and negatively correlated to a second portion of the first input resistance after the point.

8. The frontend of claim 1, comprising:
   a second input resistance coupled to the tap node and operative to form a voltage divider with the first input resistance such that the input voltage supplied at the input node is divided and the divided voltage is provided at the tap node.

9. A measurement device, comprising:
   a frontend including:
      a circuit board;
      a first input resistance coupled between an input node and a tap node and positioned on the circuit board, the first input resistance having a length and being configured to receive an input signal at the input node and provide a first signal at the tap node; and
      a feed forward element coupled to the tap node and positioned along at least a portion of the length of the first input resistance and a distance away from the first input resistance, the feed forward element being operative to introduce an element capacitance that offsets a parasitic capacitance in a volume between the feed forward element and the first input resistance; and
   circuitry, coupled to the tap node, configured to:
      detect, at the tap node, the first signal representative of the input signal at the input node; and
      based on the detected first signal, determine at least one electrical quantity of the input signal.

10. The measurement device of claim 9, wherein the feed forward element is funnel-shaped.

11. The measurement device of claim 9, wherein the feed forward element is a metallic plate and has a width that increases along the portion of the length of the first input resistance, and the width of the feed forward element at a point along the portion of the length of the first input resistance is determined based on a capacitance ratio of the element capacitance to the parasitic capacitance at the point along the length of the first input resistance.

12. The measurement device of claim 11, wherein the capacitance ratio is proportional to a first portion of the first input resistance up to the point and inversely proportional to a second portion of the first input resistance after the point.

13. The measurement device of claim 9, wherein the input signal is a high voltage input signal.

14. The measurement device of claim 9, wherein the first input resistance is a plate having an interwinding serpentine or etched trace resistance and the feed forward element is a metallic plate.

15. The measurement device of claim 9, comprising:
  a shield, surrounding the first input resistance, operative to induce the parasitic capacitance.

16. The measurement device of claim 9, comprising:
  a second input resistance coupled to the tap node and operative to form a voltage divider with the first input resistance such that the input signal supplied at the input node is divided and the first signal is provided at the tap node as a divided signal.

17. A method, comprising:
  inducing an element capacitance between a first input resistance and a feed forward element positioned along at least a portion of a length of the first input resistance, the first input resistance being coupled between an input node configured to receive an input voltage and a tap node configured to provide a divided voltage, the feed forward element being positioned a distance away from the first input resistance, and the feed forward element being coupled to the tap node; and
  offsetting, using the element capacitance, a parasitic capacitance in a volume between the feed forward element and the first input resistance.

18. The method of claim 17, wherein the feed forward element is a metallic plate and has a width that increases along the portion of the length of the first input resistance.

19. The method of claim 17, wherein the feed forward element is funnel-shaped.

* * * * *